(12) United States Patent
Bae et al.

(10) Patent No.: US 12,092,681 B2
(45) Date of Patent: Sep. 17, 2024

(54) BATTERY MANAGEMENT APPARATUS AND METHOD

(71) Applicant: LG Energy Solution, Ltd., Seoul (KR)

(72) Inventors: Yoon-Jung Bae, Daejeon (KR); A-Ming Cha, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 134 days.

(21) Appl. No.: 17/924,028

(22) PCT Filed: Dec. 15, 2021

(86) PCT No.: PCT/KR2021/019124
§ 371 (c)(1),
(2) Date: Nov. 8, 2022

(87) PCT Pub. No.: WO2022/145822
PCT Pub. Date: Jul. 7, 2022

(65) Prior Publication Data
US 2023/0168292 A1     Jun. 1, 2023

(30) Foreign Application Priority Data
Dec. 28, 2020   (KR) .................. 10-2020-0184946

(51) Int. Cl.
    *G01R 31/14*        (2006.01)
    *G01R 31/382*      (2019.01)
    *G01R 31/389*      (2019.01)

(52) U.S. Cl.
    CPC .......... *G01R 31/14* (2013.01); *G01R 31/382* (2019.01); *G01R 31/389* (2019.01)

(58) Field of Classification Search
    CPC ..... G01R 31/14; G01R 31/382; G01R 31/389
    See application file for complete search history.

(56) References Cited

U.S. PATENT DOCUMENTS

2012/0019253 A1    1/2012   Ziegler et al.
2012/0182020 A1    7/2012   Akutsu et al.
                 (Continued)

FOREIGN PATENT DOCUMENTS

JP       2012079582 A     4/2012
JP       2012-222945 A    11/2012
             (Continued)

OTHER PUBLICATIONS

Extended European Search Report for EP Application 21915620.5 dated Dec. 11, 2023.

(Continued)

*Primary Examiner* — Walter L Lindsay, Jr.
*Assistant Examiner* — Milton Gonzalez
(74) *Attorney, Agent, or Firm* — Bryan Cave Leighton Paisner LLP

(57) ABSTRACT

A battery management apparatus includes an EIS unit configured to output an AC current to a battery at a plurality of times and generate an EIS profile representing a resistance of the battery as a corresponding relationship between a real part and an imaginary part at each of the plurality of times, and a control unit configured to obtain the plurality of EIS profiles for the battery generated by the EIS unit, determine a plurality of arcs in each of the plurality of EIS profiles, calculate an arc resistance value for each of the plurality of determined arcs, calculate a resistance change rate for the arc resistance value between corresponding arcs among the plurality of arcs, and determine each of the plurality of arcs as a negative electrode-originated arc or a positive electrode-originated arc based on the plurality of calculated resistance change rates and a preset criterion change rate.

12 Claims, 5 Drawing Sheets

(56) References Cited

U.S. PATENT DOCUMENTS

| | | |
|---|---|---|
| 2012/0316815 A1 | 12/2012 | Morigaki |
| 2013/0320987 A1 | 12/2013 | Passot et al. |
| 2014/0218042 A1 | 8/2014 | Koba et al. |
| 2016/0107535 A1 | 4/2016 | Delobel et al. |
| 2017/0179737 A1 | 6/2017 | Emi et al. |
| 2018/0126863 A1 | 5/2018 | Delobel et al. |
| 2018/0156872 A1 | 6/2018 | Oguma et al. |
| 2021/0344212 A1 | 11/2021 | Jee et al. |

FOREIGN PATENT DOCUMENTS

| | | | | |
|---|---|---|---|---|
| JP | 2014-44149 A | | 3/2014 | |
| JP | WO2012095913 A1 | | 6/2014 | |
| JP | 2015032572 A | * | 2/2015 | ........... G01N 27/026 |
| JP | 2016-90346 A | | 5/2016 | |
| JP | 2017-118642 A | | 6/2017 | |
| JP | 6337233 B2 | | 6/2018 | |
| JP | 6356226 B2 | | 7/2018 | |
| JP | 201915664 A | | 1/2019 | |
| KR | 20120082330 A | | 7/2012 | |
| KR | 20130133701 A | | 12/2013 | |
| KR | 20180062814 A | | 6/2018 | |
| KR | 20180063825 A | | 6/2018 | |
| KR | 102099908 B1 | | 4/2020 | |
| KR | 102140632 B1 | | 8/2020 | |
| KR | 20200122903 A | | 10/2020 | |
| WO | 2012/073997 A1 | | 6/2012 | |
| WO | WO-2016071801 A1 | * | 5/2016 | ........... G01N 27/026 |

OTHER PUBLICATIONS

International Search Report for PCT/KR2021/019124 mailed Mar. 23, 2022. 3 pgs.

* cited by examiner

BATTERY MANAGEMENT APPARATUS AND METHOD

CROSS-REFERENCE TO RELATED APPLICATIONS

The present application is a national phase entry under 35 U.S.C. § 371 of International Application No. PCT/KR2021/019124 filed Dec. 15, 2021, which claims priority from Korean Patent Application No. 10-2020-0184946 filed Dec. 28, 2020, all of which are incorporated herein by reference.

TECHNICAL FIELD

The present disclosure relates to a battery management apparatus and method, and more particularly, to a battery management apparatus and method capable of distinguishing a plurality of arcs included in an Electrochemical Impedance Spectroscopy (EIS) profile of a battery into a negative electrode-originated arc and a positive electrode-originated arc.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance batteries allowing repeated charging and discharging are being actively studied.

Batteries commercially available at present include nickel-cadmium batteries, nickel hydrogen batteries, nickel-zinc batteries, lithium batteries and the like. Among them, the lithium batteries are in the limelight since they have almost no memory effect compared to nickel-based batteries and also have very low self-charging rate and high energy density.

Conventionally, the state of the battery is estimated through electrochemical impedance spectroscopy (EIS). However, as the battery is degraded, a plurality of arcs may be included in the Nyquist plot expressed by the electrochemical impedance spectroscopy. Since the plurality of arcs are affected to some extent by both the negative electrode and the positive electrode, it has been difficult in the prior art to distinguish the plurality of arcs into a negative electrode-originated arc and a positive electrode-originated arc.

SUMMARY

Technical Problem

The present disclosure is designed to solve the problems of the related art, and therefore the present disclosure is directed to providing a battery management apparatus and method, which may distinguish an arc associated with an increase in negative electrode resistance and an arc associated with an increase in positive electrode resistance in an EIS profile.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

A battery management apparatus according to one aspect of the present disclosure may comprise: an electrochemical impedance spectroscopy (EIS) instrument configured to output an alternating current (AC current) to a battery at a plurality of times and generate a plurality of EIS profiles, each EIS profile representing a resistance of the battery as a relationship between corresponding real and imaginary parts at a respective time of the plurality of times; a controller; and memory having stored thereon instructions that, when executed, are configured to cause the controller to obtain the plurality of EIS profiles for the battery; for each EIS profile determine a plurality of arcs of the EIS profile, calculate an arc resistance value for each of the plurality of determined arcs, for each determined arc calculate a resistance change rate between an arc resistance value of the arc and an arc resistance value of a corresponding arc of a preceding EIS profile, and determine whether the arc is a negative electrode-originated arc or a positive electrode-originated arc based on the calculated resistance change rate and a preset threshold change rate.

The instructions may be configured to cause the controller to set a first resistance change rate equal to or less than the threshold change rate and a second resistance change rate greater than the threshold change rate.

The instructions may be configured to cause the controller to determine a plurality of arcs corresponding to the first resistance change rate as the negative electrode-originated arc and determine a plurality of arcs corresponding to the second resistance change rate as the positive electrode-originated arc.

The instructions may be configured to cause the controller to obtain at least one of (i) a battery profile representing a relationship between state of charge (SOC) and voltage of the battery or (ii) a differential profile representing a relationship between the SOC and a differential voltage for the SOC, and set a threshold SOC section based on at least one of the battery profile and the differential profile.

The instructions may be configured to cause the controller to select a first SOC and a second SOC in the threshold SOC section.

The EIS instrument may be configured to generate a first EIS profile for the battery in a first state corresponding to the first SOC and a second EIS profile for the battery in a second state corresponding to the second SOC.

The instructions may be configured to cause the controller to select a first SOC and a second SOC in the threshold SOC section, determine a first voltage corresponding to the first SOC, and determine a second voltage corresponding to the second SOC.

The EIS instrument may be configured to generate a first EIS profile for the battery in a first state corresponding to the first voltage and a second EIS profile for the battery in a second state corresponding to the second voltage.

The instructions may be configured to cause the controller to select a negative electrode flat section of the battery in the battery profile and set the selected negative electrode flat section as the threshold SOC section.

The instructions may be configured to cause the controller to determine a target peak in the differential profile and set a SOC section equal to or greater than a SOC corresponding to the determined target peak as the threshold SOC section.

The target peak may have a largest differential voltage in a SOC section of 40% to 100% in the differential profile.

The EIS instrument may be configured to generate the plurality of EIS profiles in one charging and discharging cycle for the battery.

A battery pack according to another aspect of the present disclosure may comprise the battery management apparatus according to an aspect of any of the embodiments described in the present disclosure.

A battery management method according to still another aspect of the present disclosure may comprise: outputting, by an EIS instrument, an AC current to a battery at a plurality of times; generating, by the EIS instrument, a plurality of EIS profiles, each EIS profile representing a resistance of the battery as a corresponding relationship between corresponding real and imaginary parts at a respective time of the plurality of times; for each EIS profile determining, by an controller, a plurality of arcs in the EIS profile; calculating, by the controller, an arc resistance value for each of the plurality of determined arcs; for each determined arc calculating, by the controller, a resistance change rate between an arc resistance value of the arc and an arc resistance value of a corresponding arc of a preceding EIS profile; and determining whether the arc is a negative electrode-originated arc or a positive electrode-originated arc based on the calculated resistance change rate and a preset threshold change rate.

Advantageous Effects

According to one aspect of the present disclosure, there is an advantage in that the plurality of arcs included in the EIS profile may be specifically distinguished and diagnosed into a negative electrode-originated arc and a positive electrode-originated arc. Therefore, in the process of diagnosing the state of the battery according to the EIS profile, the negative electrode degradation state of the battery may be more specifically diagnosed according to the negative electrode-originated arc, and the positive electrode degradation state of the battery according to the positive electrode-originated arc may be diagnosed more specifically.

The effects of the present disclosure are not limited to the effects mentioned above, and other effects not mentioned will be clearly understood by those skilled in the art from the description of the claims.

BRIEF DESCRIPTION OF THE DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

DETAILED DESCRIPTION

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise.

In addition, throughout the specification, when a portion is referred to as being "connected" to another portion, it is not limited to the case that they are "directly connected", but it also includes the case where they are "indirectly connected" with another element being interposed between them.

Hereinafter, preferred embodiments of the present disclosure will be described in detail with reference to the accompanying drawings.

Figure 1:
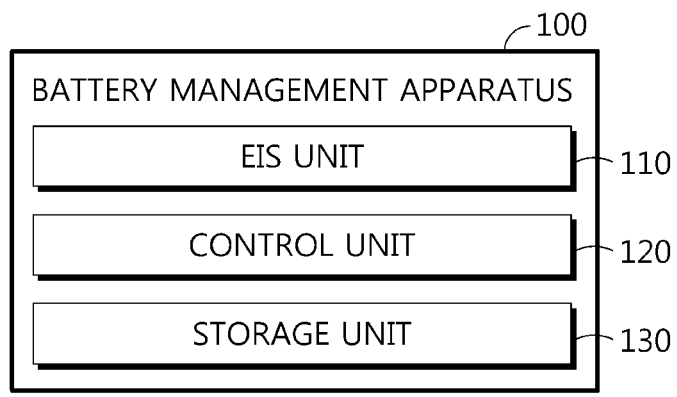
FIG. 1 is a diagram schematically showing a battery management apparatus according to an embodiment of the present disclosure.

FIG. 1 is a diagram schematically showing a battery management apparatus 100 according to an embodiment of the present disclosure.

Referring to FIG. 1, the battery management apparatus 100 according to an embodiment of the present disclosure may include an EIS unit 110 and a control unit 120.

Here, the battery may mean one physically separable independent cell including a negative electrode terminal and a positive electrode terminal. For example, one pouch-type lithium polymer cell may be regarded as a battery. In addition, the battery may refer to a battery module in which a plurality of battery cells are connected in series and/or in parallel. However, for convenience of explanation, hereinafter, the battery will be described as meaning one battery cell.

The EIS unit 110 may measure the resistance of the battery through electrochemical impedance spectroscopy (EIS).

Specifically, the EIS unit 110 may be configured to output an AC current to the battery at a plurality of time points.

The plurality of time points at which the EIS unit 110 outputs an AC current to the battery may mean different time points in one charging and discharging cycle of the battery.

For example, at the first time point of the 100$^{th}$ charging and discharging cycle of the battery, the EIS unit 110 may output an AC current to the battery. Also, at the second time point of the 100$^{th}$ charging and discharging cycle of the battery, the EIS unit 110 may output an AC current to the battery. Here, the first time point and the second time point may be different time points, and the first time point may be a time point earlier than the second time point.

The EIS unit 110 may be configured to generate an EIS profile representing the resistance of the battery as a corresponding relationship between a real part and an imaginary part at each time point.

Specifically, the EIS profile may be expressed as an X-Y graph and/or an X-Y table when the real part is set to X and the imaginary part is set to Y. The unit of the real part may be expressed as Zre [Ohm, Ω], and the unit of the imaginary part may be expressed as −Zim [Ohm, Ω]. For example, the EIS profile may be expressed as a Nyquist plot.

Figure 2:
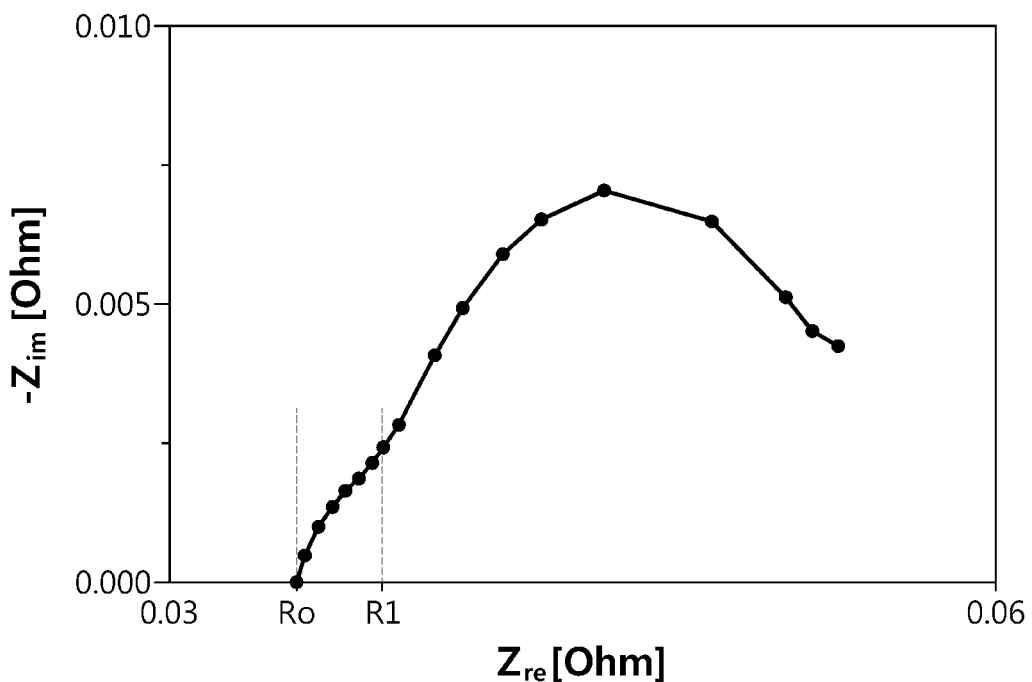
FIG. 2 is a diagram schematically showing a first EIS profile according to an embodiment of the present disclosure.
Figure 3:
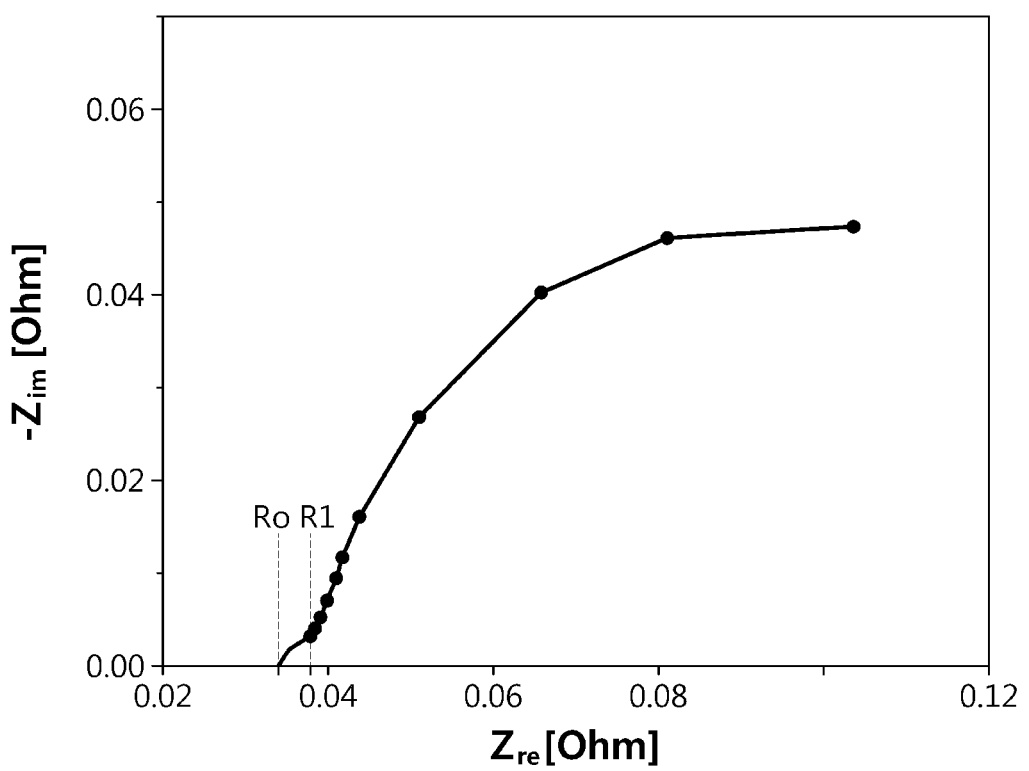
FIG. 3 is a diagram schematically showing a second EIS profile according to an embodiment of the present disclosure.

FIG. 2 is a diagram schematically showing a first EIS profile according to an embodiment of the present disclosure. FIG. 3 is a diagram schematically showing a second EIS profile according to an embodiment of the present disclosure.

Specifically, the first EIS profile is a profile generated after the EIS unit 110 outputs the AC current to the battery at the first time point. In addition, the second EIS profile is a profile generated after outputting the AC current to the battery at the second time point.

The control unit 120 may be configured to obtain a plurality of EIS profiles for the battery generated by the EIS unit 110.

For example, the control unit 120 may be connected to communicate with the EIS unit 110. The EIS unit 110 may output the plurality of generated EIS profiles, and the control unit 120 may receive the plurality of EIS profiles output from the EIS unit 110.

The control unit 120 may be configured to determine a plurality of arcs in each of the plurality of EIS profiles. Specifically, the control unit 120 may be configured to determine the number of the plurality of arcs in each of the plurality of EIS profiles.

In the embodiment of FIG. 2, the control unit 120 may determine that two arcs are included in the first EIS profile based on the change rate of the imaginary part $(-Z_{im})$ for the real part $(Z_{re})$.

In addition, in the embodiment of FIG. 3, the control unit 120 may determine that two arcs are included in the second EIS profile based on the change rate of the imaginary part $(-Z_{im})$ for the real part $(Z_{re})$.

For example, in the first EIS profile and the second EIS profile, an increase/decrease trend of the change rate of the imaginary part $(-Z_{im})$ with respect to the real part $(Z_{re})$ may be changed based on R1. Specifically, in the section before R1, the change rate of the imaginary part $(-Z_{im})$ for the real part $(Z_{re})$ tends to decrease, but from R1, the change rate of the imaginary part $(-Z_{im})$ for the real part $(Z_{re})$ may be increased. Accordingly, the control unit 120 may determine that two arcs are included in each of the first EIS profile and the second EIS profile based on R1.

As another example, the control unit 120 may determine that two arcs are included in each of the first EIS profile and the second EIS profile, based on a change in curvature in each of the first EIS profile and the second EIS profile. For example, in the embodiments of FIGS. 2 and 3, based on the R1 point, the curvature in the section before R1 and the curvature in the section after R1 may be significantly different from each other. Accordingly, the control unit 120 may determine that two arcs are included in each of the first EIS profile and the second EIS profile based on R1.

The control unit 120 may be configured to calculate a resistance change rate for the arc resistance value between corresponding arcs among the plurality of arcs.

First, the control unit 120 may determine an equivalent circuit model (ECM) corresponding to each of the plurality of EIS profiles.

For example, in the embodiments of FIGS. 2 and 3, since the control unit 120 determines that two arcs are included in each of the first EIS profile and the second EIS profile, an equivalent circuit model including two RC parallel circuits may be determined as an equivalent circuit model corresponding to the first EIS profile and the second EIS profile.

In addition, the control unit 120 may calculate a first arc resistance value for the first arc and a second arc resistance value for the second arc by applying a curve fitting algorithm to the EIS profile and the equivalent circuit model, respectively.

For example, in the first EIS profile of FIG. 2, the first arc resistance value may be calculated as 3 mΩ, and the second arc resistance value may be calculated as 21 mΩ. In addition, in the second EIS profile of FIG. 3, the first arc resistance value may be calculated as 4 mΩ, and the second arc resistance value may be calculated as 122 mΩ.

The control unit 120 may calculate a resistance change rate for the arc resistance value between the first arcs and calculate a resistance change rate for the arc resistance value between the second arcs.

For example, the control unit 120 may calculate the resistance change rate for the first arc by calculating the ratio of the first arc resistance value of the second EIS profile to the first arc resistance value of the first EIS profile. Specifically, the control unit 120 may calculate the resistance change rate for the first arc as 1.3 by calculating the formula of "4 mΩ÷3 mΩ".

In addition, the control unit 120 may calculate the resistance change rate for the second arc by calculating the ratio of the second arc resistance value of the second EIS profile to the second arc resistance value of the first EIS profile. Specifically, the control unit 120 may calculate the resistance change rate for the second arc as 5.9 by calculating the formula of "122 mΩ÷21 mΩ".

In addition, the control unit 120 may be configured to determine each of the plurality of arcs as a negative electrode-originated arc or a positive electrode-originated arc based on the calculated of plurality resistance change rates and a preset criterion change rate.

Specifically, the control unit 120 may be configured to set a resistance change rate equal to or less than the criterion change rate among the plurality of resistance change rates as a first resistance change rate and set the remaining resistance change rates as a second resistance change rate.

In addition, the control unit 120 may be configured to determine a plurality of arcs corresponding to the first resistance change rate in the plurality of EIS profiles as negative electrode-originated arcs and determine a plurality of arcs corresponding to the second resistance change rate in the plurality of EIS profiles as positive electrode-originated arcs.

Here, the negative electrode-originated arc may be an arc that is more affected by resistance increase due to negative electrode degradation rather than positive electrode degradation. Conversely, the positive electrode-originated arc may be an arc that is more affected by resistance increase due to positive electrode degradation rather than negative electrode degradation.

As in the previous embodiment, it is assumed that the resistance change rate for the first arc is calculated as 1.3, and the resistance change rate for the second arc is calculated as 5.9. Also, it is assumed that the criterion change rate is preset as 2. The control unit 120 may set the resistance change rate (1.3) for the first arc that is less than the criterion change rate (2) as the first resistance change rate, and set the resistance change rate (5.9) for the second arc as the second resistance change rate. In addition, the control unit 120 may determine the first arc of the first EIS profile and the first arc of the second EIS profile corresponding to the first resistance change rate (1.3) as a negative electrode-originated arc. In addition, the control unit 120 may determine the second arc of the first EIS profile and the second arc of the second EIS profile corresponding to the second resistance change rate (5.9) as a positive electrode-originated arc.

The battery management apparatus 100 according to an embodiment of the present disclosure does not simply analyze an arc according to the magnitude of the arc (e.g., arc resistance value) or the order of the arc appearing in the EIS profile, but may specifically analyze the arc based on the resistance change rate between corresponding arcs in the plurality of EIS profiles.

That is, since the battery management apparatus 100 does not simply distinguish a negative electrode-originated arc and a positive electrode-originated arc based on the form of the EIS profile, a plurality of arcs included in the EIS profile may be specifically distinguished and diagnosed as a negative electrode-originated arc or a positive electrode-originated arc.

Therefore, in the process of diagnosing the state of the battery based on the EIS profile, the negative electrode degradation state of the battery may be diagnosed more specifically according to the negative electrode-originated arc, and the positive electrode degradation state of the battery may be diagnosed more specifically according to the positive electrode-originated arc.

Meanwhile, the control unit 120 provided in the battery management apparatus 100 may selectively include processors known in the art, application-specific integrated circuit (ASIC), other chipsets, logic circuits, registers, communication modems, data processing devices, and the like to execute various control logic performed in the present disclosure. Also, when the control logic is implemented in software, the control unit 120 may be implemented as a set of program modules. At this time, the program module may be stored in a memory and executed by the control unit 120. The memory may be located inside or out of the control unit 120 and may be connected to the control unit 120 by various well-known means.

In addition, the battery management apparatus 100 may further include a storage unit 130. The storage unit 130 may store data necessary for operation and function of each component of the battery management apparatus 100, data generated in the process of performing the operation or function, or the like. The storage unit 130 is not particularly limited in its kind as long as it is a known information storage means that can record, erase, update and read data. As an example, the information storage means may include random access memory (RAM), flash memory, read-only memory (ROM), electrically erasable programmable read-only memory (EEPROM), registers, and the like. In addition, the storage unit 130 may store program codes in which processes executable by the control unit 120 are defined.

For example, the plurality of EIS profiles generated by the EIS unit 110 may be stored in the storage unit 130. In addition, the control unit 120 may access the storage unit 130 to obtain a plurality of stored EIS profiles.

Hereinafter, a plurality of time points at which an EIS profile is generated by the EIS unit 110 will be described in detail.

The control unit 120 may be configured to obtain at least one of a battery profile representing a corresponding relationship between state of charge (SOC) and voltage of the battery and a differential profile representing a corresponding relationship between the SOC and a differential voltage (dV/dSOC) for the SOC.

The control unit 120 may receive at least one of the battery profile and the differential profile from the outside. Alternatively, at least one of the battery profile and the differential profile may be stored in the storage unit 130, and the control unit 120 may access the storage unit 130 to obtain at least one of the battery profile and the differential profile.

The control unit 120 may be configured to set a criterion SOC section based on at least one of the battery profile and the differential profile. Here, the SOC represents a state of charge (SOC) of the battery, and may be expressed as "0 to 1" or "0% to 100%". A specific embodiment in which the control unit 120 sets the criterion SOC section will be described later with reference to FIGS. 4 and 5.

For example, the control unit 120 may be configured to select a first SOC and a second SOC in the set criterion SOC section. The EIS unit 110 may be configured to generate an EIS profile for a battery in a first state corresponding to the first SOC and generate an EIS profile for a battery in a second state corresponding to the second SOC.

That is, when the first SOC and the second SOC are selected by the control unit 120, the EIS unit 110 may generate a first EIS profile when the SOC of the battery is the first SOC in one charging and discharging cycle and generate a second EIS profile when the SOC of the battery is the second SOC.

Preferably, the EIS unit 110 may generate the first EIS profile of the battery first and generate the second EIS profile later. That is, the first time point at which the first EIS profile is generated may be earlier than the second time point at which the second EIS profile is generated.

As another example, the control unit 120 may be configured to select a first SOC and a second SOC in the set criterion SOC section, determine a first voltage corresponding to the first SOC, and determine a second voltage corresponding to the second SOC. In addition, the EIS unit 110 may be configured to generate an EIS profile for a battery in a first state corresponding to the first voltage and generate an EIS profile for a battery in a second state corresponding to the second voltage.

Figure 4:
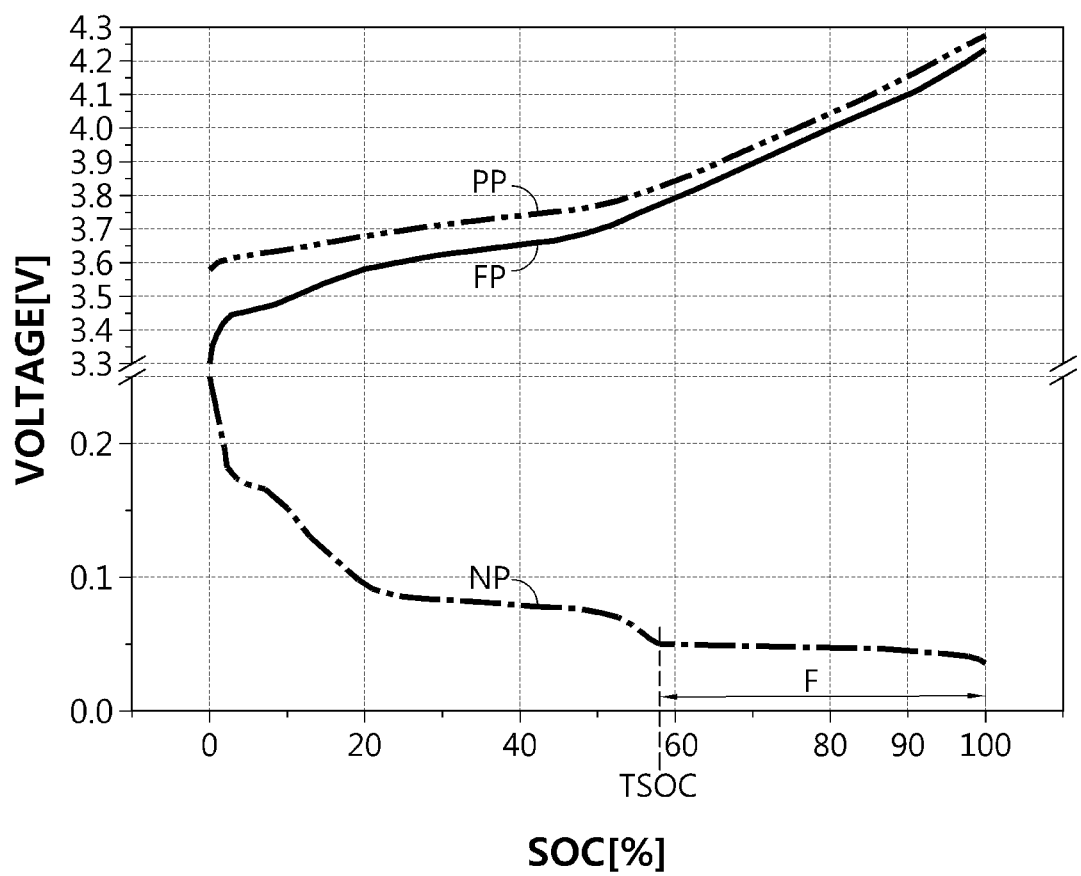
FIG. 4 is a diagram schematically showing a battery profile according to an embodiment of the present disclosure.

For example, the first voltage determined by the control unit 120 may be 3.9 V, and the second voltage may be 4.2 V. In the embodiment of FIG. 2, the EIS unit 110 may generate a first EIS profile for the battery when the voltage of the battery is 3.9 V. In the embodiment of FIG. 4, the EIS unit 110 may generate a second EIS profile for the battery when the voltage of the battery is 4.2 V. Similar to the embodiment in which the EIS profile is generated based on the SOC, the EIS unit 110 may generate the first EIS profile first when the voltage of the battery is the first voltage and then generate the second EIS profile when the voltage of the battery is the second voltage. That is, the first time point at which the first EIS profile is generated may be earlier than the second time point at which the second EIS profile is generated.

Also, preferably, in order to prevent the resistance change rate calculated by the control unit 120 from being affected by the temperature of the battery, the temperature of the battery when the EIS profile is generated may be the same. For example, the EIS unit 110 may generate a first EIS profile when the voltage of the battery is 3.9 V and the temperature of the battery is 25° C. In addition, the EIS unit 110 may generate a second EIS profile when the voltage of the battery is 4.2 V and the temperature of the battery is 25° C.

The battery management apparatus according to an embodiment of the present disclosure may generate a plurality of EIS profiles for the battery in a state where the remaining conditions except for SOC and voltage are the same. That is, the plurality of generated EIS profiles may be only affected by the SOC and voltage of the battery, and may not affected, or extremely less affected, by the degradation degree of the battery according to the charging and discharging cycle and the temperature of the battery. Therefore, the battery management apparatus has an advantage of more accurately distinguishing the negative electrode-originated arc and the positive electrode-originated arc in consideration of the current state of the battery in the plurality of generated EIS profiles.

Hereinafter, a specific embodiment in which the control unit 120 sets the criterion SOC section will be described.

Here, the criterion SOC section is an SOC section in which the first SOC and the second SOC may be selected by the control unit 120, and it may be a SOC section induced such that the plurality of arcs included in the plurality of EIS profiles can be distinguished into a negative electrode-originated arc and a positive electrode-originated arc.

That is, the criterion SOC section may be an SOC section induced such that the plurality of arcs included in the corresponding EIS profile can be distinguished into a negative electrode-originated arc and a positive electrode-originated arc.

In one embodiment, the control unit 120 may be configured to select a negative electrode flat section of the battery in the battery profile and set the selected negative electrode flat section as the criterion SOC section.

FIG. 4 is a diagram schematically showing a battery profile BP according to an embodiment of the present disclosure.

Specifically, the battery profile BP may be a profile configured to represent a corresponding relationship between the SOC and voltage of the battery. Specifically, the battery profile BP may include a positive electrode profile PP, a negative electrode profile NP, and a full cell profile FP for the battery.

In addition, the control unit 120 may determine a negative electrode flat section in the negative electrode profile NP of the battery profile BP. Here, the negative electrode flat section may mean a section in which the negative electrode voltage of the battery is the same or changes within a predetermined range even if the SOC of the battery is increased in the negative electrode profile NP of the battery. That is, the negative electrode flat section refers to a section in which the negative electrode voltage does not change or hardly changes even when the SOC of the battery is increased.

In general, the negative electrode flat section may appear at about 50% SOC or above.

For example, in the embodiment of FIG. 4, referring to the negative electrode profile NP, the negative electrode flat section may be a percentage target SOC (TSOC %) up to 100% section based on the SOC. Accordingly, the control unit 120 may be configured to set the SOC section of TSOC % to 100% as a criterion SOC section F.

In addition, when the control unit 120 selects a plurality of SOCs included in the criterion SOC section F, the EIS unit 110 may generate a plurality of EIS profiles based on the plurality of SOCs selected by the control unit 120 (or a plurality of voltages corresponding thereto).

Therefore, since the plurality of EIS profiles are generated in consideration of the negative electrode flat section, the plurality of arcs included in the plurality of EIS profiles may be specifically distinguished into a negative electrode-originated arc in which the resistance change rate is equal to or less than the criterion change rate and a positive electrode-originated arc in which the resistance change rate exceeds the criterion change rate.

That is, since the battery management apparatus according to an embodiment of the present disclosure generates a plurality of EIS profiles in consideration of the negative electrode flat section that is less affected by the negative electrode, there is an advantage that the plurality of arcs included in the plurality of EIS profiles may be specifically distinguished into a negative electrode-originated arc and a positive electrode-originated arc.

In another embodiment, the control unit 120 may be configured to determine a target peak in the differential profile and set a SOC section equal to or greater than a SOC corresponding to the determined target peak as the criterion SOC section.

Figure 5:
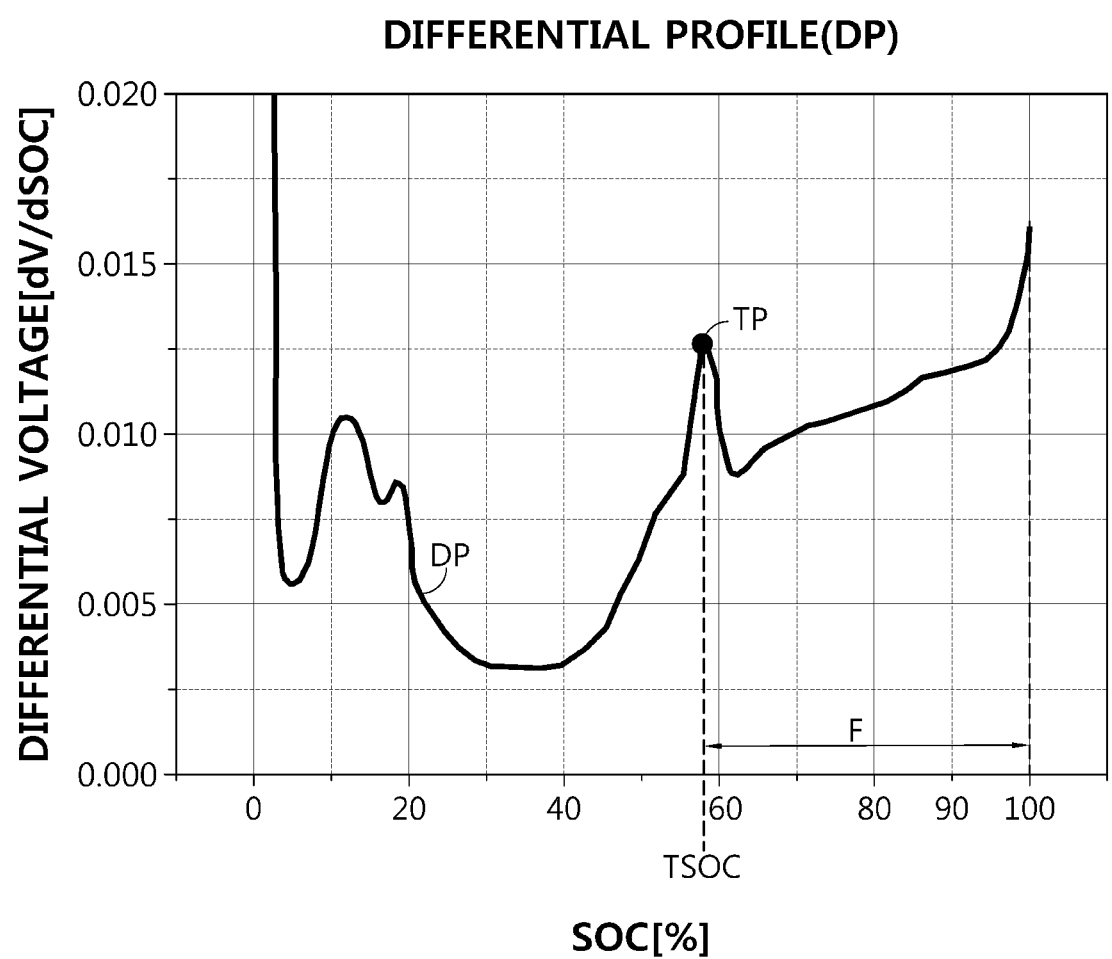
FIG. 5 is a diagram schematically showing a differential profile according to an embodiment of the present disclosure.

FIG. 5 is a diagram schematically showing a differential profile DP according to an embodiment of the present disclosure. The differential profile DP may be a profile representing a corresponding relationship between the SOC of the battery and the differential voltage (dV/dSOC) for the SOC.

The differential profile DP may include a plurality of peaks. Here, the peak is a point at which the instantaneous change rate of the differential voltage with respect to the SOC is 0 in the differential profile DP, and may be a point at which the instantaneous change rate changes from positive to negative based on the peak. That is, the peak may be a point having an upward convex form in the differential profile DP.

The control unit 120 may determine a peak included in a specific SOC section among the plurality of peaks included in the differential profile DP as the target peak TP. If several peaks are included in a specific SOC section among the plurality of peaks included in the differential profile DP, the control unit 120 may determine a peak having a largest corresponding differential voltage as the target peak TP.

Specifically, the specific SOC section may be preset to include the SOC where the negative electrode flat section starts in the negative electrode profile NP of the battery. Preferably, the control unit 120 may be configured to determine a peak having a largest differential voltage in the SOC section of 40% to 100% in the differential profile as the target peak TP. More preferably, the control unit 120 may be configured to determine the target peak TP in the SOC section of 40% to 70%.

For example, in the embodiment of FIG. 5, the target peak TP may be determined in the SOC of TSOC % in the differential profile DP. In addition, the control unit 120 may set the SOC section of TSOC % to 100% as the criterion SOC section F.

Specifically, the SOC corresponding to the target peak TP of the differential profile DP may correspond to the SOC at which the negative electrode flat section of the negative electrode profile NP starts. Accordingly, when the control unit 120 cannot obtain the negative electrode profile NP for the battery, the criterion SOC section F may be set by determining the target peak TP in the differential profile DP of the battery.

For example, when the battery is installed at an electric vehicle or an energy storage system (ESS), it may not be possible to obtain a negative electrode profile NP for the battery in a non-destructive manner. Accordingly, the control unit 120 may set the criterion SOC section F by determining the target peak TP in the differential profile DP for the battery.

That is, since the criterion SOC section F is set in consideration of the negative electrode flat section of the battery even in the differential profile DP, the plurality of arcs included in the plurality of EIS profiles may be specifically distinguished into a negative electrode-originated arc in which the resistance change rate is less than or equal to the criterion change rate and a positive electrode-originated arc in which the resistance change rate exceeds the criterion change rate.

More preferably, the control unit 120 may set the criterion SOC in consideration of both the battery profile BP and the differential profile DP.

For example, the control unit 120 may select the first SOC section according to the negative electrode flat section in the negative electrode profile NP of the battery. In addition, the control unit 120 may select the second SOC section based on the target peak TP in the differential profile DP.

In addition, when the first SOC section and the second SOC section are the same, the control unit 120 may set the first SOC section (or the second SOC section) as the criterion SOC section F.

If the first SOC section and the second SOC section are not the same, the control unit 120 may set the second SOC section as the criterion SOC section F.

For example, in the embodiment of FIG. 5, since the target peak TP is a point at which an instantaneous change rate of the differential voltage with respect to the SOC is 0, an error may be very small in the process of calculating the target SOC (TSOC) corresponding to the target peak TP. On the other hand, in the embodiment of FIG. 4, in the process of determining the start SOC of the negative electrode flat section in the negative electrode profile NP, an error may be greater than in the process of determining the target SOC (TSOC) corresponding to the target peak TP.

Therefore, when the first SOC section based on the negative electrode profile NP and the second SOC section based on the differential profile DP are different from each other, the control unit 120 may set the criterion SOC section F more accurately based on the target peak TP included in the differential profile DP.

The battery management apparatus 100 according to the present disclosure may be applied to a BMS (Battery Management System). That is, the BMS according to the present disclosure may include the battery management apparatus 100 described above. In this configuration, at least some of the components of the battery management apparatus 100 may be implemented by supplementing or adding functions of the configuration included in the conventional BMS. For example, the EIS unit 110, the control unit 120 and the storage unit 130 may be implemented as components of the BMS.

In addition, the battery management apparatus 100 according to the present disclosure may be provided in a battery pack. That is, the battery pack according to the present disclosure may include the above-described battery management apparatus 100 and one or more battery cells. In addition, the battery pack may further include electrical equipment (relays, fuses, etc.) and a case.

Figure 6:
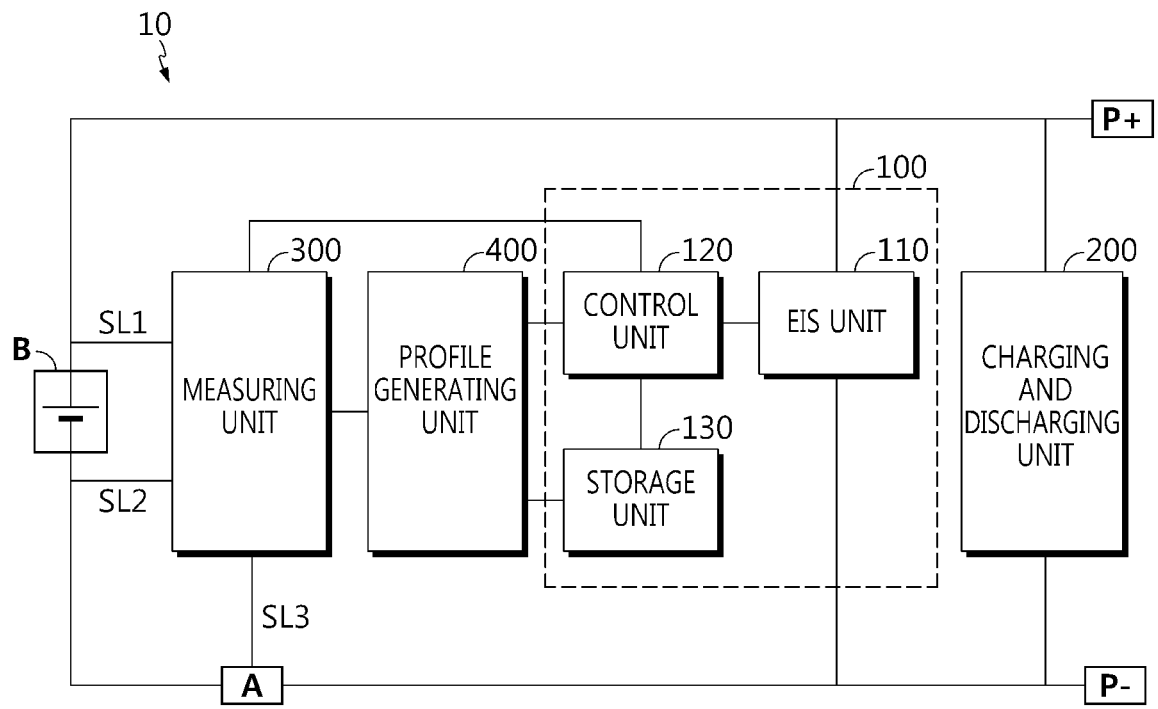
FIG. 6 is a diagram schematically showing an exemplary configuration of a battery pack according to another embodiment of the present disclosure.

FIG. 6 is a diagram schematically showing an exemplary configuration of a battery pack 10 according to another embodiment of the present disclosure.

Referring to FIG. 6, the battery pack 10 may include the battery management apparatus 100, a charging and discharging unit 200, a measuring unit 300, and a profile generating unit 400.

The charging and discharging unit 200 may be configured to be connected to a high current path of the battery pack 10 to charge and/or discharge the battery B.

For example, in the embodiment of FIG. 6, the charging and discharging unit 200 may have one end connected between a positive electrode terminal of the battery B and a positive electrode terminal P+ of the battery pack 10 and the other end connected between a negative electrode terminal of the battery B and a negative electrode terminal P− of the battery pack 10.

The measuring unit 300 may be connected to both ends of the battery B and configured to measure the voltage of the battery B.

For example, the measuring unit 300 may be connected to the positive electrode terminal of the battery B through a first sensing line SL1 and connected to the negative electrode terminal of the battery B through a second sensing line SL2. The measuring unit 300 may measure the positive electrode voltage of the battery B through the first sensing line SL1 and measure the negative electrode voltage of the battery B through the second sensing line SL2. In addition, the measuring unit 300 may measure the voltage of the battery B by calculating the difference between the measured positive electrode voltage and the measured negative electrode voltage.

In addition, the measuring unit 300 may be connected to an ampere measuring unit A through a third sensing line SL3 to measure the current of the battery B. For example, the ampere measuring unit A may be a shunt resistor or an ammeter.

The profile generating unit 400 may receive information of the battery B about the voltage and current of the battery B from the measuring unit 300 and generate a battery profile BP and a differential profile DP based on the received information of the battery B. The battery profile BP and the differential profile DP generated by the profile generating unit 400 may be transmitted to the control unit 120 or stored in the storage unit 130.

Figure 7:
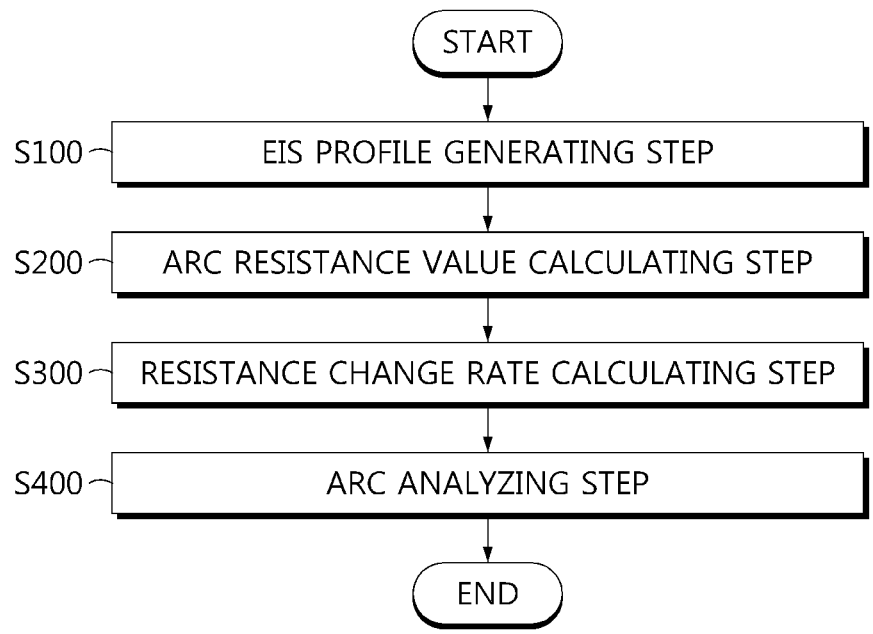
FIG. 7 is a diagram schematically showing a battery management method according to still another embodiment of the present disclosure.

FIG. 7 is a diagram schematically showing a battery management method according to still another embodiment of the present disclosure.

Preferably, each step of the battery management method may be performed by the battery management apparatus. Hereinafter, contents overlapping with the previously described contents will be omitted or briefly described.

Referring to FIG. 7, the battery management method may include an EIS profile generating step (S100), an arc resistance value calculating step (S200), a resistance change rate calculating step (S300), and an arc analyzing step (S400).

The EIS profile generating step (S100) is a step of outputting an AC current to a battery at a plurality of time points and generating an EIS profile representing a resistance of the battery as a corresponding relationship between a real part and an imaginary part at each of the plurality of time points, and may be performed by the EIS unit 110.

For example, referring to FIG. 2, the EIS unit 110 may generate a first EIS profile for the battery at a first time point. Also, referring to FIG. 3, the EIS unit 110 may generate a second EIS profile for the battery at a second time point later than the first time point.

The arc resistance value calculating step (S200) is a step of determining a plurality of arcs in each of the plurality of EIS profiles generated in the EIS profile generating step (S100), and calculating an arc resistance value for each of the plurality of determined arcs, and may be performed by the control unit 120.

First, the control unit 120 may determine the number of the plurality of arcs in each of the plurality of EIS profiles. In addition, the control unit 120 may calculate an arc resistance value for the arc included in each of the plurality of EIS profiles by using the EIS profile, an equivalent circuit model corresponding to the number of arcs, and a curve fitting algorithm.

For example, in the embodiment of FIG. 2, the first EIS profile may include a first arc and a second arc based on R1. In addition, the first arc resistance value for the first arc may be calculated as 3 mΩ, and the second arc resistance value for the second arc may be calculated as 21 mΩ.

Also, in the embodiment of FIG. 3, the second EIS profile may also include a first arc and a second arc based on R1. In addition, the first arc resistance value for the first arc may be calculated as 4 mΩ, and the second arc resistance value for the second arc may be calculated as 122 mΩ.

The resistance change rate calculating step (S300) is a step of calculating a resistance change rate for the arc resistance value between corresponding arcs among the plurality of arcs, and may be performed by the control unit 120.

The control unit 120 may calculate a resistance change rate between the arc resistance values of the first arcs and calculate a resistance change rate between the arc resistance values of the second arcs.

For example, the resistance change rate between the first arc resistance value (3 mΩ) of the first EIS profile and the first arc resistance value (4 mΩ) of the second EIS profile may be calculated as 1.3. In addition, the resistance change rate between the second arc resistance value (21 mΩ) of the first EIS profile and the second arc resistance value (122 mΩ) of the second EIS profile may be calculated as 5.9.

The arc analyzing step (S400) is a step of determining each of the plurality of arcs as a negative electrode-originated arc or a positive electrode-originated arc based on the plurality of calculated resistance change rates and a preset criterion change rate, and may be performed by the control unit 120.

Specifically, the control unit 120 may compare the magnitude between the plurality of calculated resistance change rates and the criterion change rate. In addition, the control unit 120 may set a resistance change rate equal to or less than the criterion change rate among the plurality of resistance change rates as a first resistance change rate and set a resistance change rate greater than the criterion change rate as a second resistance change rate. Finally, the control unit 120 may determine the arc corresponding to the first resistance change rate as a negative electrode-originated arc and determine the arc corresponding to the second resistance change rate as a positive electrode-originated arc.

The plurality of time points at which the plurality of EIS profiles are generated in the EIS profile generating step (S100) of the battery management method according to an embodiment of the present disclosure may be time points selected based on a criterion SOC section F in which the effect of negative electrode degradation is minimized Therefore, the battery management method has an advantage of more accurately distinguishing a negative electrode-originated arc and a positive electrode-originated arc in the EIS profile.

The embodiments of the present disclosure described above may not be implemented only through an apparatus and a method, but may be implemented through a program that realizes a function corresponding to the configuration of the embodiments of the present disclosure or a recording medium on which the program is recorded. The program or recording medium may be easily implemented by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

REFERENCE SIGNS

10: battery pack
100: battery management apparatus
110: EIS unit
120: control unit
130: storage unit
200: charging and discharging unit
300: measuring unit
400: profile generating unit

What is claimed is:

1. A battery management apparatus, comprising:
an EIS unit configured to output an AC current to a battery at a plurality of time points and generate an EIS profile representing a resistance of the battery as a corresponding relationship between a real part and an imaginary part at each of the plurality of time points; and
a control unit configured to obtain the plurality of EIS profiles for the battery generated by the EIS unit, determine a plurality of arcs in each of the plurality of EIS profiles, calculate an arc resistance value for each of the plurality of determined arcs, calculate a resistance change rate for the arc resistance value between corresponding arcs among the plurality of arcs, and determine each of the plurality of arcs as a negative electrode-originated arc or a positive electrode-originated arc based on the plurality of calculated resistance change rates and a preset criterion change rate.

2. The battery management apparatus according to claim 1,
wherein the control unit is configured to set a resistance change rate equal to or less than the criterion change rate among the plurality of resistance change rates as a first resistance change rate and set the remaining resistance change rate as a second resistance change rate.

3. The battery management apparatus according to claim 2,
wherein the control unit is configured to determine a plurality of arcs corresponding to the first resistance change rate in the plurality of EIS profiles as the negative electrode-originated arc and determine a plurality of arcs corresponding to the second resistance change rate in the plurality of EIS profiles as the positive electrode-originated arc.

4. The battery management apparatus according to claim 1,
wherein the control unit is configured to obtain at least one of a battery profile representing a corresponding relationship between SOC and voltage of the battery and a differential profile representing a corresponding relationship between the SOC and a differential voltage for the SOC, and set a criterion SOC section based on at least one of the battery profile and the differential profile.

5. The battery management apparatus according to claim 4,
wherein the control unit is configured to select a first SOC and a second SOC in the set criterion SOC section, and
wherein the EIS unit is configured to generate an EIS profile for a battery in a first state corresponding to the first SOC and generate an EIS profile for a battery in a second state corresponding to the second SOC.

6. The battery management apparatus according to claim 4,
wherein the control unit is configured to select a first SOC and a second SOC in the set criterion SOC section, determine a first voltage corresponding to the first SOC, and determine a second voltage corresponding to the second SOC, and
wherein the EIS unit is configured to generate an EIS profile for a battery in a first state corresponding to the first voltage and generate an EIS profile for a battery in a second state corresponding to the second voltage.

7. The battery management apparatus according to claim 4,
wherein the control unit is configured to select a negative electrode flat section of the battery in the battery profile and set the selected negative electrode flat section as the criterion SOC section.

8. The battery management apparatus according to claim 4,
wherein the control unit is configured to determine a target peak in the differential profile and set a SOC section equal to or greater than a SOC corresponding to the determined target peak as the criterion SOC section.

9. The battery management apparatus according to claim 8,
wherein the control unit is configured to determine a peak having a largest differential voltage in a SOC section of 40% to 100% in the differential profile as the target peak.

10. The battery management apparatus according to claim 1,
wherein the EIS unit is configured to generate the plurality of EIS profiles in one charging and discharging cycle for the battery.

11. A battery pack, comprising the battery management apparatus according to any one of claims 1 to 10.

12. A battery management method, comprising:
an electrochemical impedance spectroscopy (EIS) profile generating step of outputting an AC current to a battery at a plurality of time points and generating an EIS profile representing a resistance of the battery as a corresponding relationship between a real part and an imaginary part at each of the plurality of time points;
an arc resistance value calculating step of determining a plurality of arcs in each of the plurality of EIS profiles generated in the EIS profile generating step and calculating an arc resistance value for each of the plurality of determined arcs;
a resistance change rate calculating step of calculating a resistance change rate for the arc resistance value between corresponding arcs among the plurality of arcs; and
an arc analyzing step of determining each of the plurality of arcs as a negative electrode-originated arc or a positive electrode-originated arc based on the plurality of calculated resistance change rates and a preset criterion change rate.

* * * * *